(12) United States Patent
Takahashi et al.

(10) Patent No.: US 9,337,056 B2
(45) Date of Patent: May 10, 2016

(54) SEMICONDUCTOR DEVICE MANUFACTURING METHOD

(71) Applicant: TOKYO ELECTRON LIMITED, Tokyo (JP)

(72) Inventors: Rui Takahashi, Miyagi (JP); Ryuuu Ishita, Miyagi (JP); Kazuki Narishige, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/623,006

(22) Filed: Feb. 16, 2015

(65) Prior Publication Data

US 2015/0235862 A1  Aug. 20, 2015

(30) Foreign Application Priority Data

Feb. 17, 2014  (JP) ................. 2014-027498

(51) Int. Cl.
| | |
|---|---|
| *H01L 21/3065* | (2006.01) |
| *H01L 21/3213* | (2006.01) |
| *H01L 21/311* | (2006.01) |
| *H01L 21/02* | (2006.01) |
| *H01L 21/306* | (2006.01) |
| *H01J 37/32* | (2006.01) |
| *H01L 27/115* | (2006.01) |

(52) U.S. Cl.
CPC .... *H01L 21/32136* (2013.01); *H01L 21/02123* (2013.01); *H01L 21/30621* (2013.01); *H01L 21/31116* (2013.01); *H01L 21/31144* (2013.01); *H01L 21/32135* (2013.01); *H01L 21/32137* (2013.01); *H01L 21/32139* (2013.01); *H01J 37/32091* (2013.01); *H01J 37/32165* (2013.01); *H01J 2237/334* (2013.01); *H01L 27/11582* (2013.01)

(58) Field of Classification Search
None
See application file for complete search history.

(56) References Cited

U.S. PATENT DOCUMENTS 8,598,040 B2 * 12/2013 Le Gouil ............. H01L 21/3065
  216/58
2013/0059450 A1  3/2013 Le Gouil et al.

* cited by examiner

*Primary Examiner* — Jiong-Ping Lu
(74) *Attorney, Agent, or Firm* — Rothwell, Figg, Ernst & Manbeck, P.C.

(57) ABSTRACT

A semiconductor device manufacturing method for etching a multilayer film using a mask is provided. The method includes (a) supplying a first gas containing hydrogen, hydrogen bromide, nitrogen trifluoride and at least one of hydrocarbon, fluorocarbon and fluorohydrocarbon into the processing chamber and exciting the first gas to etch the multilayer film from a top surface of the multilayer film to a predetermined position in a stacked direction of the multilayer film; and (b) supplying a second gas that does not substantially contain hydrogen bromide and contains hydrogen and nitrogen trifluoride and at least one of Thydrocarbon, fluorocarbon and fluorohydrocarbon into the processing chamber and exciting the second gas to etch the multilayer film from the predetermined position of the multilayer film to a top surface of the etching stop layer.

12 Claims, 9 Drawing Sheets

SEMICONDUCTOR DEVICE MANUFACTURING METHOD

CROSS-REFERENCE TO RELATED APPLICATIONS

This application claims priority to Japanese Patent Application No. 2014-027498 filed on Feb. 17, 2014, the entire contents of which are incorporated herein by reference.

FIELD OF THE INVENTION

The present invention relates to a semiconductor device manufacturing method.

BACKGROUND OF THE INVENTION

A NAND type flash memory device having a 3D structure is known as one of semiconductor devices. When the NAND type flash memory device having the 3D structure is manufactured, there is executed a step of forming a deep hole in a multilayer film, in which two layers having different dielectric constants are alternately and repeatedly laminated, by etching the multilayer film. Such an etching technique is disclosed in, e.g., U.S. Patent Application Publication No. 2013/0059450.

Specifically, there is disclosed in U.S. Patent Application Publication No. 2013/0059450 a technique for etching the multilayer film by performing a main etching process for exposing a target object having a mask made of amorphous silicon and formed atop the multilayer film to a plasma of a processing gas containing $CH_2F_2$ gas, $N_2$ gas and $NF_3$ gas and an overetching process for exposing the target object to a plasma of a processing gas containing $CH_2F_2$ gas, $NF_3$ gas, $CH_3F$ gas and $CH_4$ gas.

The above multilayer film needs to be etched at a high speed. Meanwhile, an etching stop layer may be formed beneath the multilayer film in order to protect wiring or the like provided below the multilayer film. Although it is preferred to etch the multilayer film having the etching stop layer in a high speed, the etching stop layer may be considerably removed in the case of etching the multilayer film by using, e.g., an etching gas that contributes to the high etching speed.

SUMMARY OF THE INVENTION

In view of the above, a method for selectively etching a multilayer film at a high speed is desired.

In accordance with one embodiment of the present invention, it is provided a semiconductor device manufacturing method for etching through a mask, in a processing chamber of a plasma processing apparatus, a multilayer film including first films and second films alternately stacked over an etching stop layer, a dielectric constant of the first films differing from that of the second films. The semiconductor device manufacturing method includes (a) supplying a first gas containing hydrogen, hydrogen bromide, nitrogen trifluoride and at least one of hydrocarbon, fluorocarbon and fluorohydrocarbon into the processing chamber and exciting the first gas to etch the multilayer film from a top surface of the multilayer film to a predetermined position by a predetermined depth in a stacked direction of the multilayer film; and (b) supplying a second gas that does not substantially contain hydrogen bromide and contains hydrogen and nitrogen trifluoride and at least one of hydrocarbon, fluorocarbon and fluorohydrocarbon into the processing chamber and exciting the second gas to etch the multilayer film from the predetermined position of the multilayer film to a top surface of the etching stop layer.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
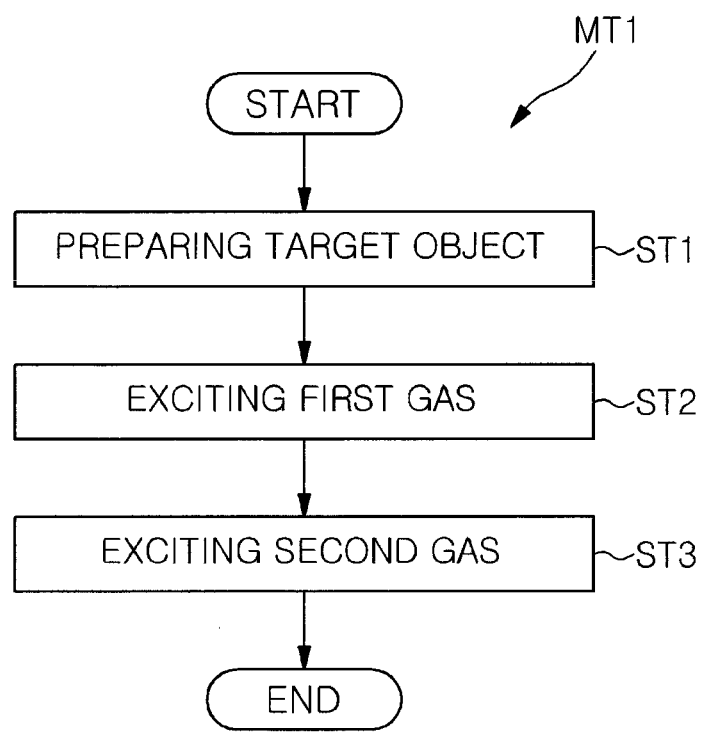
FIG. 1 is a flowchart of a method for manufacturing a semiconductor device in accordance with an embodiment of the present invention.

Hereinafter, embodiments of the present invention will be described in detail with reference to the accompanying drawings. Like reference numerals will be used for like or corresponding parts in the respective drawings.

FIG. 1 is a flowchart representing a method for manufacturing a semiconductor device in accordance with an embodiment of the present invention, especially, a method for etching a multilayer film in accordance with an embodiment of the present invention. Specifically, a method MT1 shown in FIG. 1 may be used for manufacturing a NAND type flash memory device having a 3D structure. The method MT1 includes steps ST1 to ST3.

Figure 2:
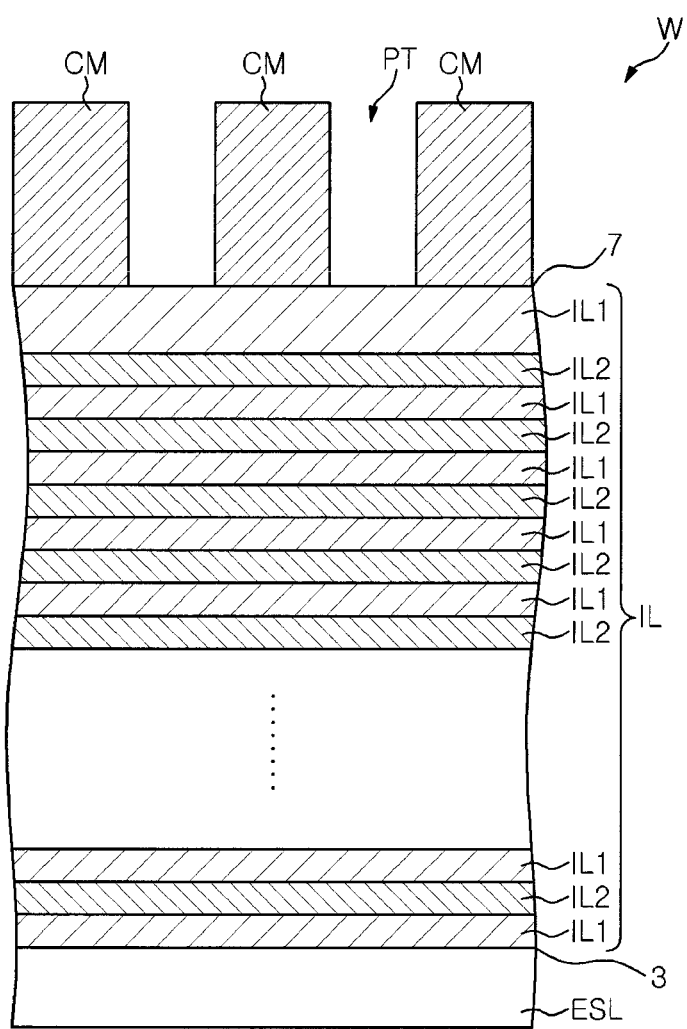
FIG. 2 shows an exemplary wafer prepared in a step ST1.

In the step ST1, a processing target object (hereinafter, referred to as "wafer") W is prepared. FIG. 2 shows an example of the wafer W prepared in the step ST1. The wafer W shown in FIG. 2 includes an etching stop layer ESL, a multilayer film IL, and a mask CM in that order. The etching stop layer ESL may be an insulating film containing metal and formed on a substrate. Specifically, the etching stop layer ESL may be made of metal such as aluminum oxide (AlO), zirconium (ZrO) or the like. The etching stop layer ESL is provided in order to stop the etching of the multilayer film IL on a top surface 3 thereof directly contacting with the multilayer film IL.

The multilayer film IL is formed on the etching stop layer ESL. The multilayer film IL has a structure in which dielectric films IL1 and IL2 having different dielectric constants are alternately laminated. In one embodiment, the dielectric film IL1 may be a silicon oxide film and the dielectric film IL2 may be a silicon nitride film. In another embodiment, the dielectric film IL1 may be a silicon oxide film and the dielectric film IL2 may be a polysilicon film. A thickness of the dielectric film IL1 is, e.g., about 5 nm to 50 nm. A thickness of the dielectric film IL2 is, e.g., about 10 nm to 75 nm. The dielectric films IL1 and IL2 may be laminated in more than 24 layers in total. The mask CM is formed atop the multilayer film IL, i.e., on a top surface 7 of the multilayer film IL. The mask CM has a pattern PT for forming deep spaces such as a plurality of holes in the multilayer film IL. The mask CM may be made of, e.g., amorphous carbon.

Figure 3:
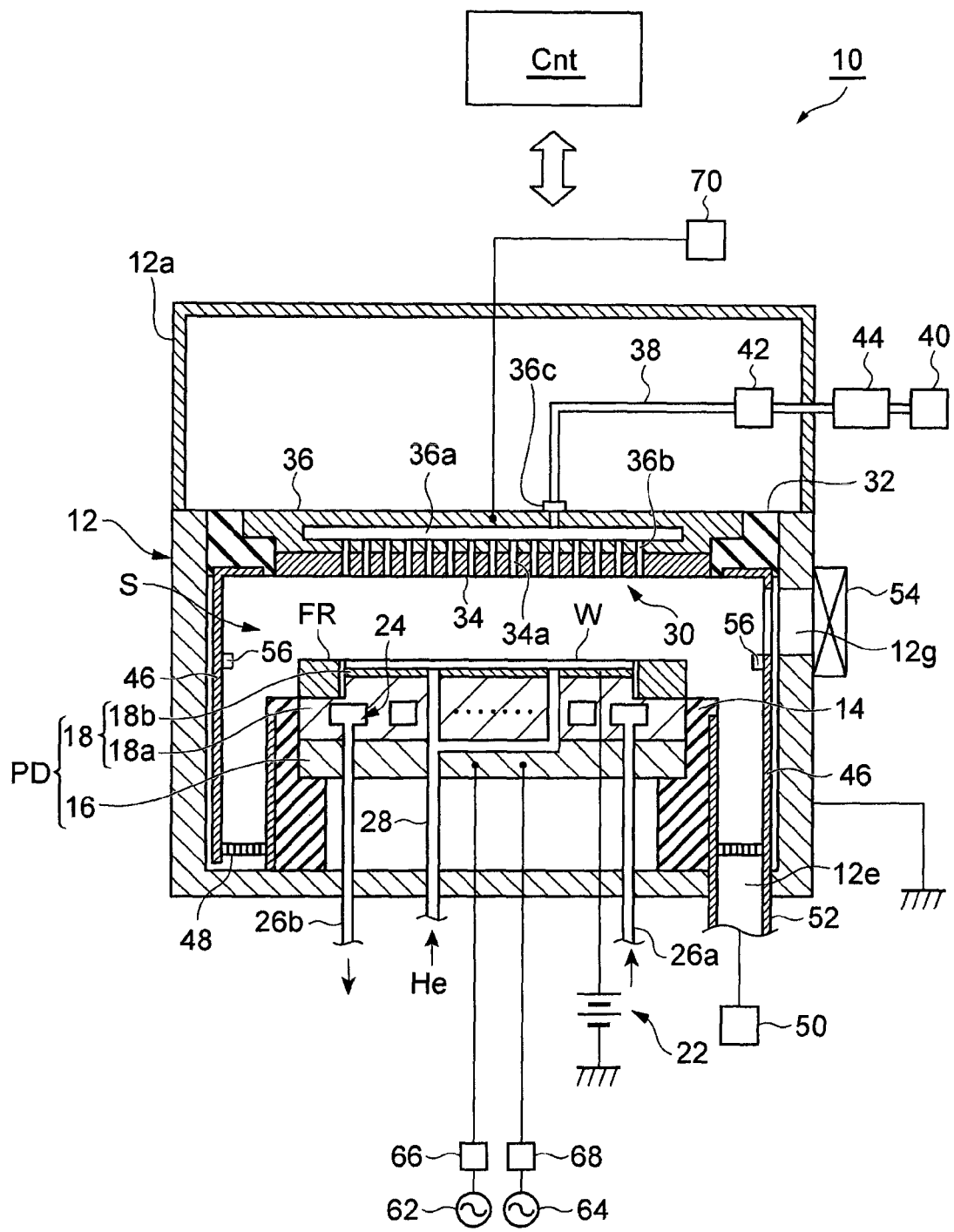
FIG. 3 schematically illustrates an exemplary plasma processing apparatus.

Referring back to FIG. 1, in the step ST1 of the method MT1, the wafer W is prepared inside a processing chamber of a plasma processing apparatus. In this example, the plasma processing apparatus may be a capacitively coupled plasma processing apparatus. Hereinafter, an example of the plasma processing apparatus that can be used for performing the method MT1 will be described. FIG. 3 schematically shows an example of the plasma processing apparatus and illustrates a vertical cross sectional view of a structure of the plasma processing apparatus.

A plasma processing apparatus 10 shown in FIG. 3 is a capacitively coupled plasma etching apparatus. The plasma processing apparatus 10 includes a substantially cylindrical processing chamber 12. An inner wall surface of the processing chamber 12 is made of anodically oxidized aluminum. The processing chamber 12 is frame grounded.

A substantially cylindrical holder 14 made of an insulating material is provided on a bottom portion of the processing chamber 12. Inside the processing chamber 12, the holder 14 extends vertically from the bottom portion of the processing chamber 12. The holder 14 supports a mounting table PD provided inside the processing chamber 12. Specifically, the mounting table PD can be supported by the holder 14 at an inner wall surface of the holder 14 as shown in FIG. 3.

The wafer W is held on the mounting table PD. The mounting table PD may include a lower electrode (electrode part) 16 and a support 18. The lower electrode 16 is made of metal, e.g., aluminum, and has a substantially disc shape. The support 18 is provided on top of the lower electrode 16.

The support 18 for supporting the wafer W includes a base portion 18a and an electrostatic chuck 18b. The base portion 18a is made of metal, e.g., aluminum, and has a substantially disc shape. The base portion 18a is formed on the lower electrode 16 and electrically connected to the lower electrode 16. The electrostatic chuck 18b is provided on the base portion 18a. The electrostatic chuck 18b has a structure where an electrode made of a conductive film is embedded between a pair of insulating layers or insulating sheets. A DC power supply 22 is electrically connected to the electrode of the electrostatic chuck 18b. The wafer W can be adsorptively held on the electrostatic chuck 18b by electrostatic force such as Coulomb force or the like generated by the DC voltage of the DC power supply 22.

A focus ring FR is provided on a periphery edge portion of the base portion 18a of the support 18 so as to surround a periphery of the wafer W and the electrostatic chuck 18b. The focus ring FR is provided in order to improve uniformity of the etching. The focus ring FR is made of a material appropriately selected depending on components of films to be etched. For example, the focus ring FR may be made of quartz.

A coolant path 24 is formed inside the base portion 18a. The coolant path 24 serves as a temperature control unit in accordance with an embodiment of the present embodiment. A coolant having a predetermined temperature is supplied from a chiller unit provided outside the plasma processing apparatus 10 and circulated in the coolant path 24 through lines 26a and 26b. By controlling the temperature of the circulating coolant, the temperature of the wafer W supported on the support 18 is controlled.

The plasma processing apparatus 10 further includes a gas supply line 28. The gas supply line 28 supplies a heat transfer gas, e.g., He gas, from a heat transfer gas supply unit to a space between the top surface of the electrostatic chuck 18b and the backside of the wafer W.

The plasma processing apparatus 10 further includes an upper electrode 30. The upper electrode 30 is provided above the mounting table PD so as to face the mounting table PD. The lower electrode 16 and the upper electrode 30 are substantially parallel to each other. A processing space S for performing plasma processing on the wafer W is formed between the upper electrode 30 and the lower electrode 16.

The upper electrode 30 is supported at an upper portion of the processing chamber 12 via an insulating shield member 32. The upper electrode 30 may include an electrode plate 34 and an electrode support 36. The electrode plate 34 faces the processing space S and has a plurality of gas injection holes 34a. The electrode plate 34 may be made of a conductor or a semiconductor having a low resistance with low Joule heat.

The electrode plate 34 is detachably supported by the electrode support 36. The electrode support 36 may be made of a conductive material, e.g., aluminum, and have a water-cooled structure. A gas diffusion space 36a is provided inside the electrode support 36. A plurality of gas holes 36b communicating with the gas injection holes 34a extends downward from the gas diffusion space 36a. A gas inlet 36c for introducing a processing gas into the gas diffusion space 36a is formed at the electrode support 36. A gas supply line 38 is connected to the gas inlet 36c.

Figure 4:
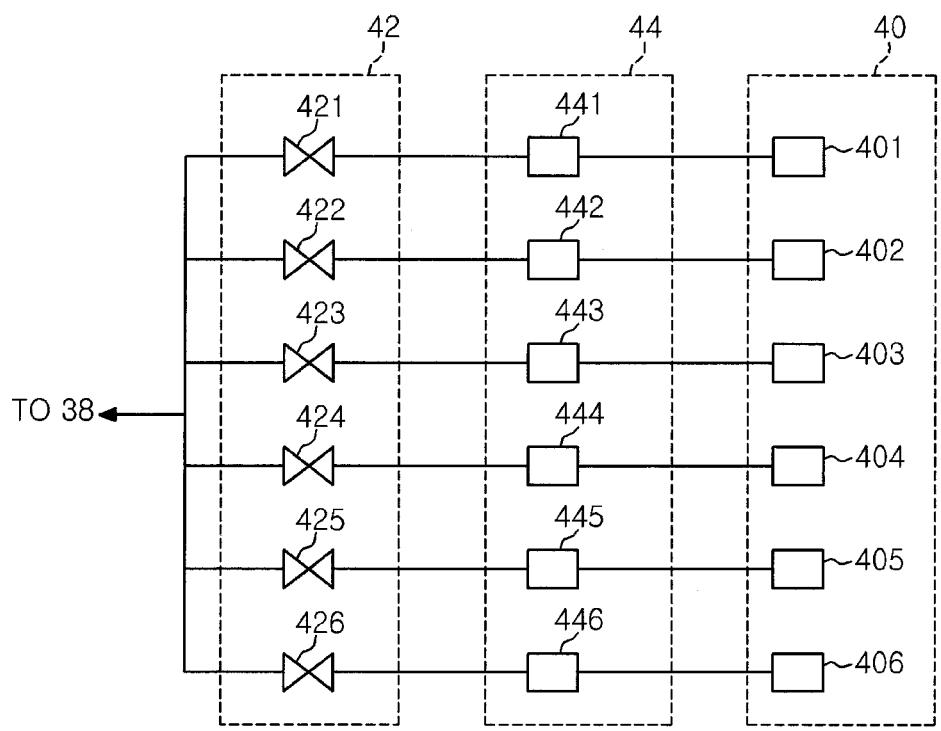
FIG. 4 specifically depicts a valve group, a flow rate controller group and a gas source group illustrated in FIG. 3.

A gas source group 40 is connected to the gas supply line 38 via a valve group 42 and a flow rate controller group 44. FIG. 4 specifically shows the valve group, the flow rate controller group, and the gas source group illustrated in FIG. 3. As shown in FIG. 4, the gas source group 40 includes a plurality of (N-number of) gas sources 401 to 406. The gas sources 401 to 406 are sources of hydrogen gas ($H_2$), hydrogen bromide gas (HBr), nitrogen trifluoride gas ($NF_3$), hydrocarbon gas, fluorocarbon gas, and a fluorohydrocarbon gas, respectively. The hydrocarbon gas may be methane gas ($CH_4$). The fluorocarbon gas may be $C_3F_8$ gas, $C_4F_6$ gas, or $C_4F_8$ gas. The fluorohydrocarbon gas may be $CH_2F_2$ gas, $CH_3F$ gas, or $CHF_3$ gas.

The flow rate controller group 44 includes a plurality of (N-number of) flow rate controllers 441 to 446. The flow rate controllers 441 to 446 control flow rates of gases supplied from the gas sources corresponding thereto. The flow rate controllers 441 to 446 may be mass flow controllers (MFC) or flow control systems (FCS). The valve group 42 includes a plurality of (N-number of) valves 421 to 426. The gas sources 401 to 406 are connected to the gas supply line 38 via the flow rate controllers 441 to 446 and the valves 421 to 426, respectively. The gases from the gas sources 401 to 406 are supplied into the gas diffusion space 36a through the gas supply line 38 and discharged into the processing space S via the gas holes 36b and the gas injection holes 34a.

Referring back to FIG. 3, the plasma processing apparatus 10 may further include a ground conductor 12a. The ground conductor 12a has a substantially cylindrical shape and extends upward from a sidewall of the processing chamber 12 to a position higher than the upper electrode 30.

In the plasma processing apparatus 10, a deposition shield 46 is detachably provided along the inner wall of the processing chamber 12. The deposition shield 46 is also provided at an outer periphery of the holder 14. The deposition shield 46 prevents an etching by-product (deposit) from adhering to the processing chamber 12. The deposition shield 46 may be made of aluminum coated with ceramic such as $Y_2O_3$ or the like.

A gas exhaust plate 48 is provided between the holder 14 and the inner wall of the processing chamber 12 at the bottom portion of the processing chamber 12. The gas exhaust plate 48 may be formed by coating aluminum with ceramic, e.g., $Y_2O_3$ or the like. In the processing chamber 12, a gas exhaust port 12e is provided below the gas exhaust plate 48. A gas exhaust unit 50 is connected to the gas exhaust port 12e via a gas exhaust line 52. The gas exhaust unit 50 has a vacuum pump such as a turbo molecular pump or the like, so that a pressure in the processing chamber 12 can be reduced to a predetermined vacuum level. A loading/unloading port 12g for the wafer W is provided at the sidewall of the processing chamber 12. The loading/unloading port 12g can be opened and closed by a gate valve 54.

A conductive member (GND block) 56 is provided at the inner wall of the processing chamber 12. The conductive member 56 is attached to the inner wall of the processing chamber 12 at the substantially same height as that of the wafer W mounted on the electrostatic chuck 18b. The conductive member 56 is connected to the DC ground and prevents abnormal discharge. The conductive member 56 may be provided at any position in a plasma generation area and the installation position thereof is not limited to the position shown in FIG. 3.

The plasma processing apparatus 10 further includes a first high frequency power supply 62 and a second high frequency power supply 64. The first high frequency power supply 62 generates a first high frequency (RF: Radio Frequency) power for plasma generation having a frequency of about 27 MHz to 100 MHz, e.g., about 60 MHz in this example. The first high frequency power supply 62 is connected to the lower electrode 16 via a matching unit 66. The matching unit 66 is a circuit for matching an output impedance of the first high frequency power supply 62 and an input impedance of a load side (the lower electrode 16 side). The first high frequency power supply 62 may be connected to the upper electrode 30 via the matching unit 66.

The second high frequency power supply 64 generates a second high frequency power for ion attraction to the wafer W, i.e., a high frequency bias power having a frequency of about 400 kHz to 13.56 MHz, e.g., about 400 kHz in this example. The second high frequency power supply 64 is connected to the lower electrode 16 via a matching unit 68. The matching unit 68 is a circuit for matching an output impedance of the second high frequency power supply 64 and an input impedance of a load side (the lower electrode 16 side).

The plasma processing apparatus 10 further includes a DC power supply unit 70. The DC power supply unit 70 is connected to the upper electrode 30. The DC power supply unit 70 can generate a negative DC voltage and apply the generated DC voltage to the upper electrode 30.

In the present embodiment, the plasma processing apparatus 10 may further include a control unit Cnt. The control unit Cnt is a computer including a processor, a storage unit, an input device, a display device or the like. The control unit Cnt controls the respective components of the plasma processing apparatus 10. The control unit Cnt can allow an operator to input commands to manage the plasma processing apparatus 10 by using the input device and display the operation state of the plasma processing apparatus 10 on the display device. The storage unit of the control unit Cnt stores therein a control program for controlling various processes performed in the plasma processing apparatus 10, or a program, i.e., a processing recipe, for causing the respective components of the plasma processing apparatus 10 to perform processes based on the processing conditions.

Specifically, the control unit Cnt transmits control signals to the flow rate controllers 441 to 446, the valves 421 to 426, the gas exhaust unit 50, and the chiller unit so that the processing gas is introduced into the processing chamber 12 during the etching of the steps ST2 and ST3 and a pressure in the processing chamber 12 and a temperature of the wafer W becomes set values.

In the present embodiment, the control unit Cnt can transmit a control signal to the first high frequency power supply 62 so that the high frequency power from the first high frequency power supply 62 is supplied to the lower electrode 16 while being switched ON and OFF in a pulsed manner. Further, the control unit Cnt can transmit a control signal to the DC power supply unit 70 so that a negative DC voltage having an absolute value greater than that applied to the lower electrode 16 in a high frequency power ON period of the first high frequency power supply 62 is applied to the upper electrode 30 in a high frequency power OFF period. The ON/OFF frequency of the high frequency power of the first high frequency power supply 62 is, e.g., 1 kHz to 90 kHz. The ON/OFF frequency of the high frequency power has as one cycle an ON period during which the high frequency power of the first high frequency power supply 62 maintains ON and an OFF period during which the high frequency power of the first high frequency power supply 62 maintains OFF. A duty ratio, of the ON period compared to the OFF period in one cycle, is, e.g., about 50% to 90%. The switching of the DC voltage of the DC power supply 62 can be synchronized with the ON/OFF switching of the high frequency power of the first high frequency power supply 62.

Referring back to FIG. 1, the method MT1 will be described further. In the step ST1, the wafer W mounted on the mounting table PD is adsorptively held by the electrostatic chuck 18b. Next, the step ST2 of the method MT is performed.

In the step ST2, a first gas from the gas source group 40 is supplied into the processing chamber 12 and is excited in the processing chamber 12. The multilayer film IL is etched with the excited first gas from a top surface 7 to a predetermined position by a predetermined depth x in a laminated direction of the multilayer film IL. The first gas contains hydrogen ($H_2$), hydrogen bromide (HBr), and nitrogen trifluoride ($NF_3$) and at least any one of hydrocarbon, fluorocarbon, and fluorohydrocarbon. As for the hydrocarbon gas, methane gas ($CH_4$) may be used. As for the fluorocarbon gas, $C_3F_8$ gas, $C_4F_6$ gas, $C_4F_8$ gas or a gaseous mixture thereof may be used. As for the fluorohydrocarbon gas, $CH_2F_2$ gas, $CH_3F$ gas, $CHF_3$ gas or a gaseous mixture thereof may be used. In this example, the first gas is a gaseous mixture of $H_2$ gas, HBr gas, $NF_3$ gas, $CH_2F_2$ gas, and $CH_4$ gas. In the step ST2, a flow rate of $H_2$ gas may be set within a range from about 100 sccm to 340 sccm; a flow rate of HBr gas may be set within a range from about 50 sccm to 100 sccm; a flow rate of $NF_3$ gas may be set within a range from about 80 sccm to 180 sccm; a flow rate of $CH_2F_2$ gas may be set within a range from about 50 sccm to 120 sccm; and a flow rate of $CH_4$ gas may be set within a range from about 40 sccm to 90 sccm, for example. In the present embodiment, in the step ST2, a pressure in the processing chamber 12 is set to a first pressure. The first pressure may be, e.g., about 65 mTorr (8.67 Pa). In the step ST2, the high frequency power from the first high frequency power supply 62 and that from the second high frequency power supply 64 are applied to the lower electrode 16.

Figure 5:
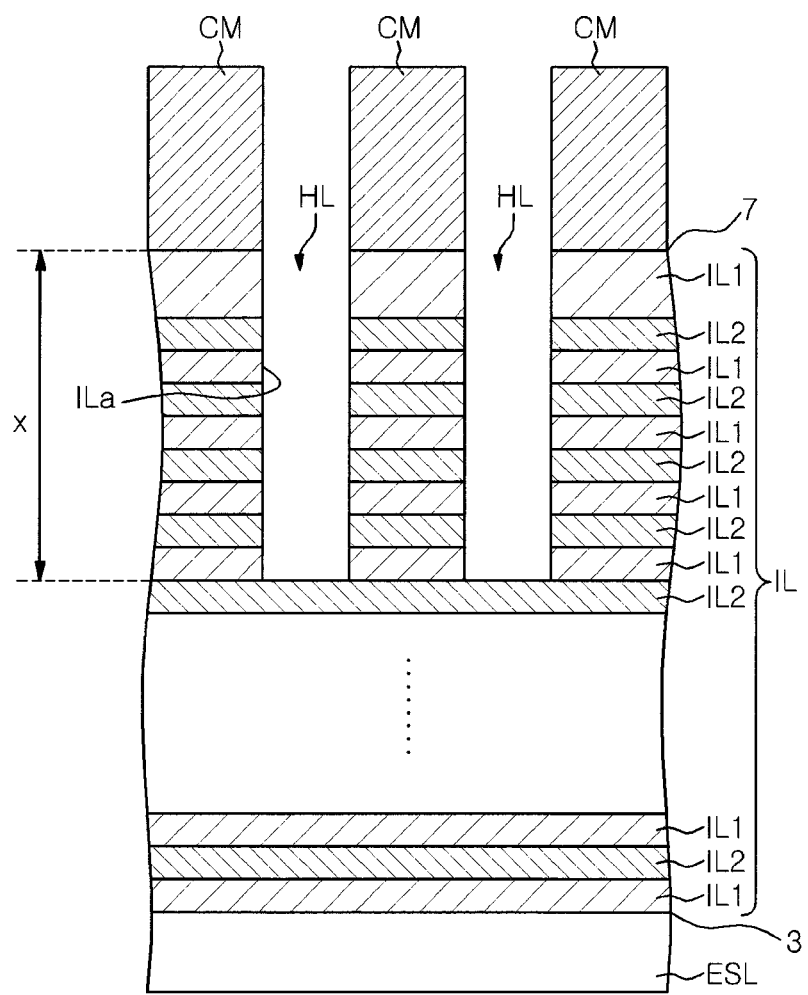
FIG. 5 describes the wafer etched in a step ST2.

In the step ST2, a plasma of the first gas is generated in the processing chamber 12. In other words, active species of hydrogen, active species of fluorine, active species of bromide and the like are generated. As shown in FIG. 5, a portion of the multilayer film IL below the opening of the mask CM is etched by the active species up to the predetermined position of the multilayer film IL. Therefore, a hole HL having a depth x is formed at the multilayer film IL. When the multilayer film IL is etched, a deposit from the first gas is adhered to a sidewall ILa defining the hole HL. Accordingly, the lateral etching of the sidewall ILa is suppressed and the generation of bowing on the sidewall ILa is suppressed. In the step ST2, the etching of the multilayer film IL is promoted by hydrogen bromide contained in the first gas, so that the multilayer film IL is etched in a high speed. When the dielectric film IL2 is a silicon nitride film, the etching rate of the dielectric film IL2 is more increased because the first gas contains active species of hydrogen. As a result, the etching rate of the multilayer film IL is further increased.

Next, a step ST3 of the method MT1 is performed. In the step ST3, a second gas from the gas source group 40 is supplied into the processing chamber 12 and is excited in the processing chamber 12. The multilayer film IL is etched from a position where the etching is completed in the step ST2, i.e., from the predetermined position in the laminated direction of the multilayer film IL, to a top surface 3 of the etching stop layer ESL. The second gas contains hydrogen ($H_2$), and nitrogen trifluoride ($NF_3$) and at least any one of hydrocarbon, fluorocarbon, and fluorohydrocarbon. However, the second gas does not substantially contain hydrogen bromide (HBr), which includes not only that the second gas does not contain HBr at all but also that the second gas contains an extremely small amount of HBr so that the etching of the step ST3 is not affected by HBr. In accordance with the o embodiment, in the step ST3, a pressure in the processing chamber 12 is set to a second pressure. The second pressure is higher than the first pressure and may be, e.g., about 80 mTorr (10.67 Pa).

For the second gas, methane gas ($CH_4$) may be used as the hydrocarbon gas; $C_3F_8$ gas, $C_4F_6$ gas, $C_4F_8$ gas or a gaseous mixture thereof may be used as the fluorocarbon gas; $CH_2F_2$ gas, $CH_3F$ gas, $CHF_3$ gas or a gaseous mixture thereof may be used as fluorohydrocarbon gas. In this example, the second gas is a gaseous mixture of $H_2$ gas, $NF_3$ gas, $CH_2F_2$ gas, and $CH_4$ gas. In the step ST3, a flow rate of $H_2$ gas may be set within a range from about 100 sccm to 340 sccm; a flow rate of $NF_3$ gas may be set within a range from about 80 sccm to 180 sccm; a flow rate of $CH_2F_2$ gas may be set within a range from about 50 sccm to 120 sccm; and a flow rate of $CH_4$ gas may be set within a range from about 40 sccm to 90 sccm. In the step ST3, the high frequency power from the first high frequency power supply 62 and that from the second high frequency power supply 64 are applied to the lower electrode 16.

Figure 6:
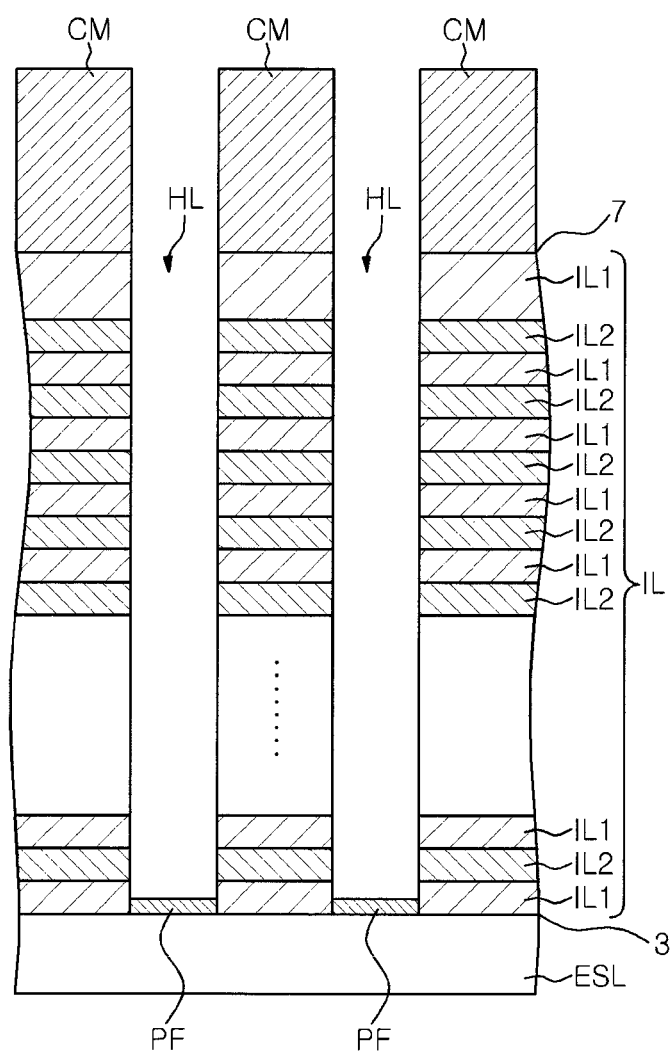
FIG. 6 shows the wafer etched in a step ST3.

In the step ST3, a plasma of the second gas is generated in the processing chamber 12. In other words, active species of fluorine and active species of hydrogen are mainly generated. The portion of the multilayer film IL below the opening of the mask CM is etched from the predetermined position in the laminated direction thereof by the active species thus generated. When the multilayer film IL is etched, a deposit from the second gas is adhered to the sidewall ILa defining the hole HL. Accordingly, the lateral etching of the sidewall ILa is suppressed and the generation of bowing on the sidewall ILa is suppressed. By executing the step ST3, the portion of the multilayer film IL which is positioned below the opening of the mask CM is etched to the top surface 3 of the etching stop layer ESL as shown in FIG. 6.

In the step ST3, when the etching stop layer ESL is exposed through the hole HL by the etching, a compound of fluorine contained in the second gas and a material contained in the etching stop layer ESL is generated as a reaction by-product. In general, a boiling point of a fluorine compound is higher than that of a bromide compound. Therefore, a large amount of the fluorine compound is deposited on the surface of the etching stop layer ESL without volatilization. Accordingly, a protective film PF made of the compound of fluorine and the material contained in the etching step layer ESL is formed on the top surface 3 of the etching stop layer ESL. When the etching stop layer ESL is made of aluminum oxide, the protective film PF becomes an aluminum fluoride (AlF) film. A boiling point of the aluminum fluoride is approximately five times higher than that of aluminum bromide (AlBr) that is a compound of bromide and aluminum oxide. Thus, aluminum fluoride is not easily volatilized. In the step ST3, even though the etching stop layer ESL is exposed through the hole HL, the etching on the etching stop layer ESL is suppressed by the protective film PF. As a result, the etching selectivity of the multilayer film IL with respect to the etching stop layer ESL is improved.

The first gas and the second gas may not substantially contain nitrogen gas ($N_2$) so that the generation of bowing on the sidewall ILa is suppressed and the etching selectivity of the multilayer film IL with respect to the mask CM is improved.

In the present embodiment, the etching may be performed in the steps ST2 and ST3 in a state where the temperature of the wafer W, i.e., the temperature of the multilayer film IL, is maintained at about 10° or below. By performing the etching in a state where the temperature of the wafer W is set to a low level, the etching rate of the etching stop layer ESL can be decreased without decreasing the etching rate of the multilayer film IL. As a result, the etching selectivity of the multilayer film IL with respect to the etching stop layer ESL can be improved.

Hereinafter, test examples employing the above-described method will be explained.

First, the dependency of the etching rate and the selectivity on the processing gas was evaluated. In the test examples 1 to 4, plasmas of different combinations of gases were generated in the processing chamber 12 of the plasma processing apparatus 10 shown in FIG. 3 and the multilayer film IL and the etching stop layer ESL were etched. Further, the etching rates of the multilayer film IL and the etching stop layer ESL and the etching selectivities of the multilayer film IL with respect to the etching stop layer ESL which were obtained in the test examples will be reviewed. In the test examples 1 to 4, a silicon oxide film was used as the dielectric film IL1 of the multilayer film IL and a polysilicon film was used as the dielectric film IL2. An AlO film was used as the etching stop layer ESL.

In the test examples 1 to 4, various gases were supplied as etching processing gases at the following flow rates into the processing chamber 12. The processing conditions other than the flow rates of the processing gases were the same.

Figure 7A:
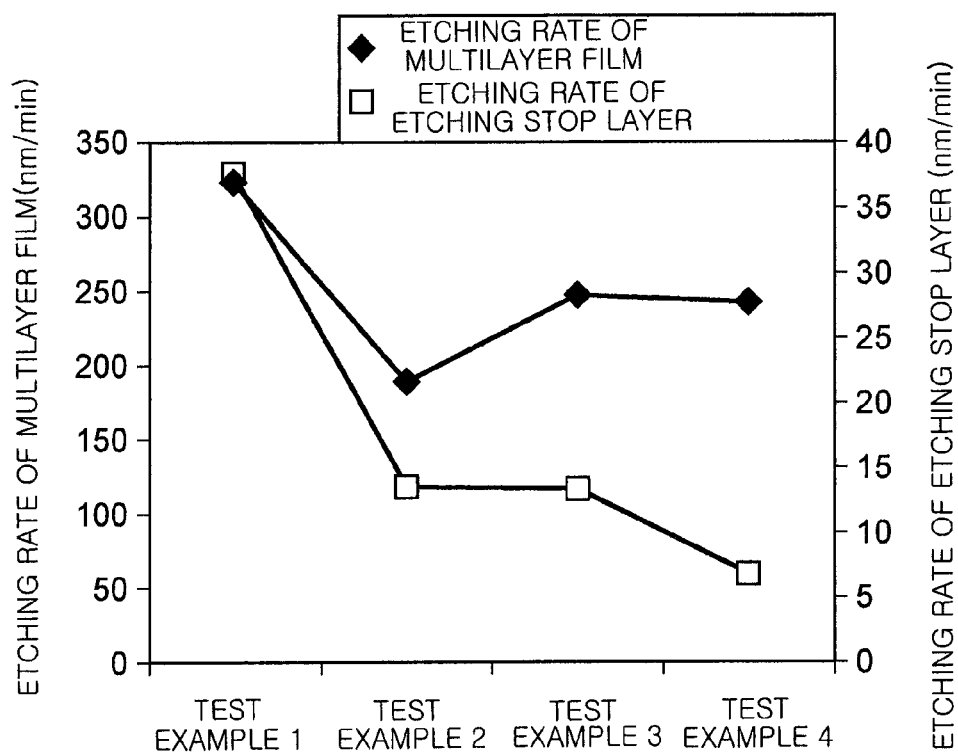
FIGS. 7A and 7B represent results of test examples 1 to 4.
Figure 7B:
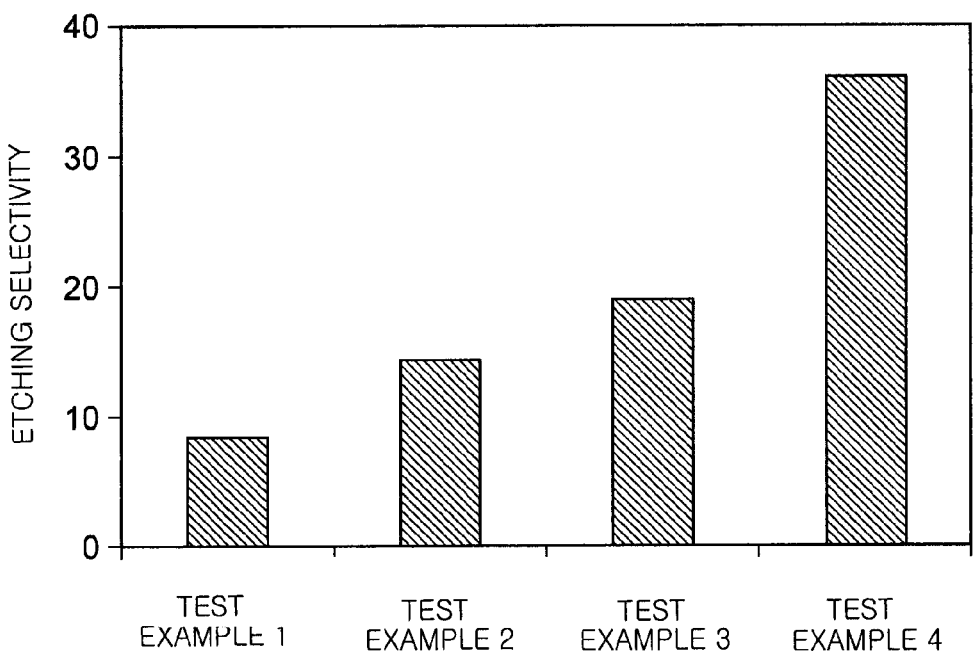

Processing Conditions in Test Example 1 flow rate of $H_2$ gas: 170 sccm
flow rate of HBr gas: 80 sccm
flow rate of $NF_3$ gas: 140 sccm
flow rate of $CH_4$ gas: 70 sccm
flow rate of $CH_2F_2$ gas: 90 sccm
flow rate of $N_2$ gas: 0 sccm Processing Conditions in Test Example 2 flow rate of $H_2$ gas: 170 sccm
flow rate of HBr gas: 0 sccm
flow rate of $NF_3$ gas: 140 sccm
flow rate of $CH_4$ gas: 70 sccm flow rate of $CH_2F_2$ gas: 90 sccm
flow rate of $N_2$ gas: 0 sccm Processing Conditions in Test Example 3 flow rate of $H_2$ gas: 170 sccm
flow rate of HBr gas: 0 sccm
flow rate of $NF_3$ gas: 140 sccm
flow rate of $CH_4$ gas: 70 sccm
flow rate of $CH_2F_2$ gas: 90 sccm
flow rate of $N_2$ gas: 120 sccm Processing Conditions in Test Example 4 flow rate of $H_2$ gas: 290 sccm
flow rate of HBr gas: 0 sccm
flow rate of $NF_3$ gas: 140 sccm
flow rate of $CH_4$ gas: 70 sccm
flow rate of $CH_2F_2$ gas: 90 sccm
flow rate of $N_2$ gas: 0 sccm FIG. 7A shows the etching rates of the multilayer film IL and the etching stop layer ESL which were obtained in the test examples 1 to 4. FIG. 7B shows the etching selectivities of the multilayer film IL with respect to the etching stop layer ESL which were obtained in the test examples 1 to 4. As shown in FIG. 7A, in the test example 1 using the processing gas to which HBr gas was added, though etching rate of the multilayer film IL was increased compared to the test examples 2 to 4, the etching rate of the etching stop layer ESL was also increased compared to the test examples 2 to 4. As a result, in the test example 1, the etching selectivity of the multilayer film IL with respect to the etching stop layer ESL was decreased, as shown in FIG. 7B. On the other hand, in the test examples 2 to 4 using a processing gas in which HBr gas was not included, though the etching rate of the multilayer film IL was slightly decreased compared to the test example 1, the etching rate of the etching stop layer ESL was considerably decreased compared to the test example 1. As a result, the etching selectivity of the multilayer film IL with respect to the etching stop layer ESL was improved, as shown in FIG. 7B. Especially, in the test example 4 using a processing gas containing a largest amount of $H_2$ gas, it was possible to increase the etching selectivity of the multilayer film IL with respect to the etching stop layer ESL by about 4.2 times than that in the test example 1.

Next, the dependency of the etching rate and the selectivity on the temperature will be described. In the test example 5, the multilayer film IL and the etching stop layer ESL were etched by the plasma processing apparatus 10 shown in FIG. 3 under the condition that the temperature of the multilayer film IL is set to about 30° C., 20° C., 10° C., and 0° C. Then, in respective cases of the multilayer film IL in different temperature, the etching rates of the multilayer film IL and the etching stop layer ESL and the etching selectivity of the multilayer film IL with respect to the etching stop layer ESL were obtained. The processing conditions other than the temperature of the multilayer film IL were the same.

Figure 8A:
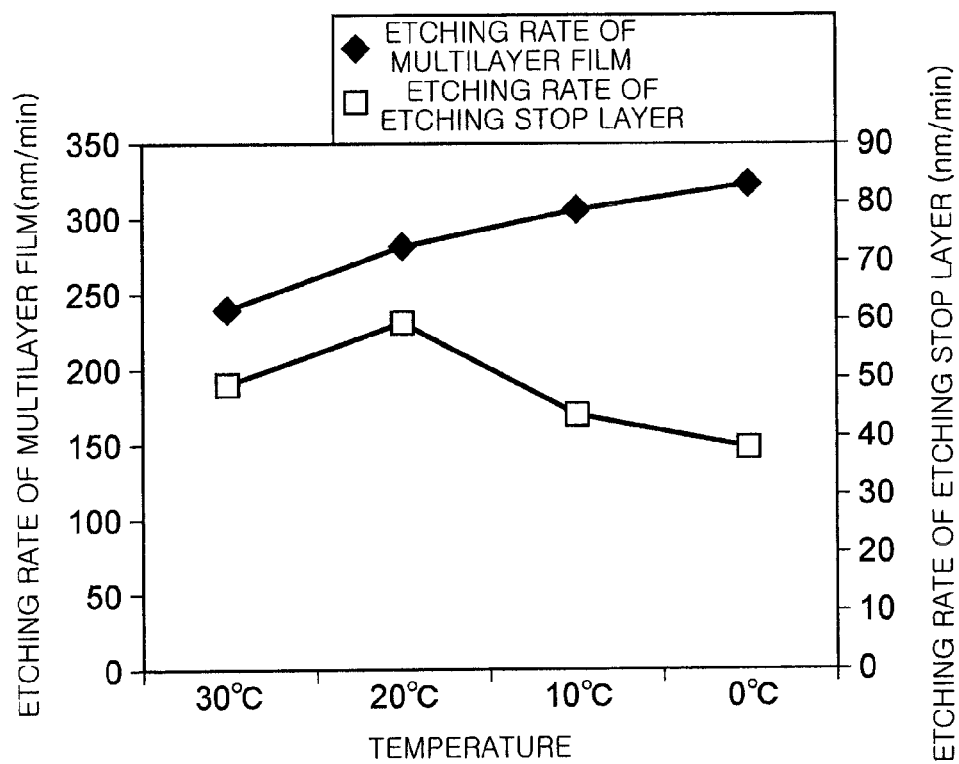
FIGS. 8A and 8B represent a result of a test example 5.
Figure 8B:
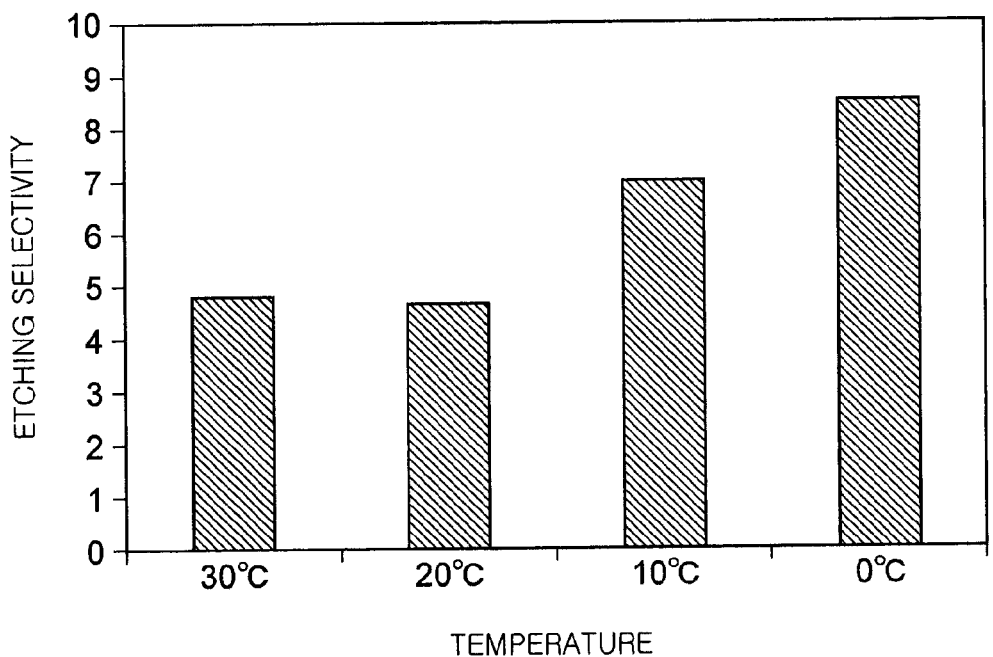

FIG. 8A shows the etching rates of the multilayer film IL and the etching stop layer ESL which were obtained in the test example 5. FIG. 8B shows the etching selectivities of the multilayer film IL with respect to the etching stop layer ESL which were obtained in the test example 5. As shown in FIG. 8A, as the temperature of the multilayer film IL was decreased, the etching rate of the multilayer film IL was improved whereas the etching rate of the etching stop layer ESL was decreased. This shows that that the etching selectivity of the multilayer film IL with respect to the etching stop layer ESL can be improved by decreasing the temperature of the multilayer film IL.

Next, the dependency of the etching rate and the selectivity on the pressure will be explained. In the test example 6, the multilayer film IL and the etching stop layer ESL were etched by the plasma processing apparatus 10 while setting a pressure in the processing chamber 12 to about 40 mTorr (5.33 Pa), 65 mTorr (8.67 Pa), and 90 mTorr (1.20 Pa). Under these conditions, the etching rates of the multilayer film IL and the etching stop layer ESL and the etching selectivity of the multilayer film IL with respect to the etching stop layer ESL were obtained. The processing conditions except the pressure in the processing chamber 12 were the same.

Figure 9A:
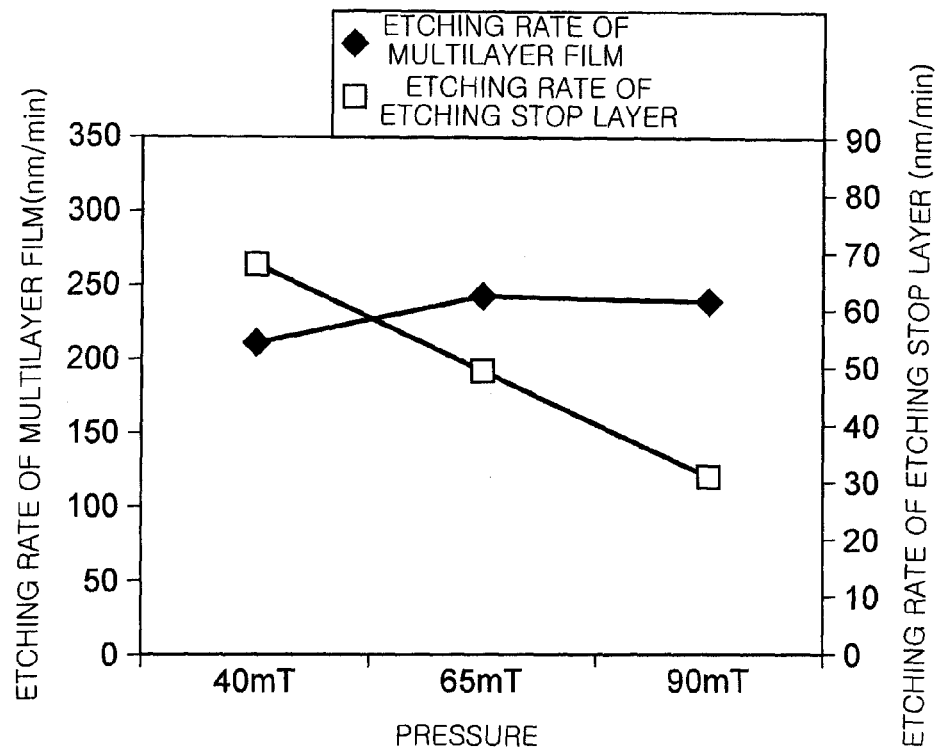
FIGS. 9A and 9B represent a result of a test example 6.
Figure 9B:
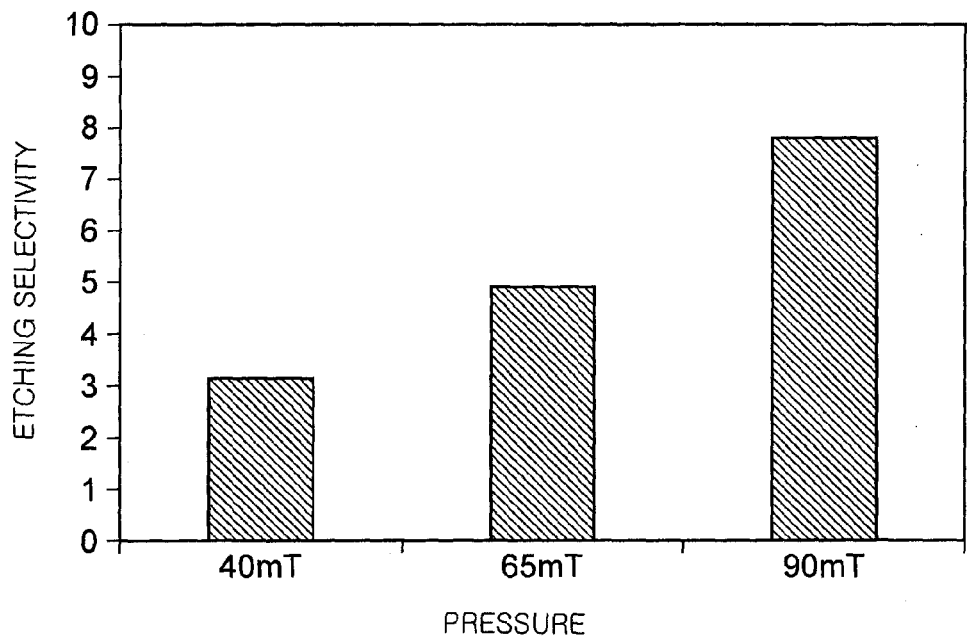

FIG. 9A shows the etching rates of the multilayer film IL and the etching stop layer ESL which were obtained in the test example 6. FIG. 9B shows the etching selectivity of the multilayer film IL with respect to the etching stop layer ESL which was obtained in the test example 6. As shown in FIG. 9A, the dependency of the etching rate of the multilayer film IL on the pressure is low, whereas the etching rate of the etching stop layer ESL highly depends on the pressure and tends to be decreased as the pressure in the processing chamber 12 is increased. From the above, it is clear that the etching selectivity of the multilayer film IL with respect to the etching stop layer ESL can be improved by increasing a pressure in the processing chamber 12 as shown in FIG. 9B.

Although the embodiments of the present invention have been described, the present invention may be variously modified without being limited thereto. For example, the plasma processing apparatus is not limited to a capacitively coupled plasma processing apparatus and may be an inductively coupled plasma processing apparatus or a plasma processing apparatus for generating a plasma by introducing a microwave into a processing chamber through a waveguide and an antenna.

While the invention has been shown and described with respect to the embodiments, it will be understood by those skilled in the art that various changes and modifications may be made without departing from the scope of the invention as defined in the following claims.

What is claimed is:

1. A semiconductor device manufacturing method for etching, in a processing chamber of a plasma processing apparatus, a multilayer film including first films and second films alternately stacked over an etching stop layer through a mask, a dielectric constant of the first films differing from that of the second films, the method comprising:
   supplying a first gas containing hydrogen, hydrogen bromide, nitrogen trifluoride and at least one of hydrocarbon, fluorocarbon and fluorohydrocarbon into the processing chamber and exciting the first gas to etch the multilayer film from a top surface of the multilayer film to a predetermined position by a predetermined depth in a stacked direction of the multilayer film; and
   supplying a second gas that does not substantially contain hydrogen bromide and contains hydrogen and nitrogen trifluoride and at least one of hydrocarbon, fluorocarbon and fluorohydrocarbon into the processing chamber and exciting the second gas to etch the multilayer film from the predetermined position of the multilayer film to a top surface of the etching stop layer.

2. The semiconductor device manufacturing method of claim 1, wherein when etching the multilayer film from the top surface of the multilayer film to the predetermined position in the stacked direction of the multilayer film, a pressure in the processing chamber is set to a first pressure; and when etching the multilayer film from the predetermined position of the multilayer film to the top surface of the etching stop layer, the pressure in the processing chamber is set to a second pressure higher than the first pressure.

3. The semiconductor device manufacturing method of claim 1, wherein the etching stop layer is an insulating layer containing metal.

4. The semiconductor device manufacturing method of claim 1, wherein the etching stop layer contains aluminum oxide.

5. The semiconductor device manufacturing method of claim 1, wherein the first gas and the second gas contains substantially no nitrogen gas.

6. The semiconductor device manufacturing method of claim 1, wherein when the multilayer film is etched, a temperature of the multilayer film is controlled to be maintained at about 10° C. or below.

7. The semiconductor device manufacturing method of claim 1, wherein the fluorocarbon includes at least one of $C_3F_8$, $C_4F_6$ and $C_4F_8$.

8. The semiconductor device manufacturing method of claim 1, wherein the fluorohydrocarbon includes at least one of $CH_2F_2$, $CH_3F$ and $CHF_3$.

9. The semiconductor device manufacturing method of claim 1, wherein the first film is a silicon oxide film and the second film is a silicon nitride film.

10. The semiconductor device manufacturing method of claim 1, wherein the first film is a silicon oxide film and the second film is a polysilicon film.

11. The semiconductor device manufacturing method of claim 1, wherein the first films and the second films are stacked in 24 or more layers in total.

12. The semiconductor device manufacturing method of claim 1, wherein the mask is made of amorphous carbon.

* * * * *